United States Patent [19]
Saito

[11] Patent Number: 5,537,951
[45] Date of Patent: Jul. 23, 1996

[54] CRYSTAL GROWTH METHOD AND APPARATUS THEREFOR

[75] Inventor: Hideaki Saito, Tokyo, Japan

[73] Assignee: NEC Corporation, Tokyo, Japan

[21] Appl. No.: 371,419

[22] Filed: Jan. 11, 1995

[30] Foreign Application Priority Data

Jan. 14, 1994 [JP] Japan .................................. 6-002454

[51] Int. Cl.$^6$ .................................................. C30B 25/04
[52] U.S. Cl. ............................. 117/89; 117/93; 117/108; 117/954
[58] Field of Search ................................ 117/89, 93, 108, 117/954

[56] References Cited

U.S. PATENT DOCUMENTS

| | | | |
|---|---|---|---|
| 3,615,931 | 10/1971 | Arthur | 117/108 |
| 3,865,625 | 2/1975 | Cho et al. | 117/108 |
| 4,411,728 | 10/1983 | Sakamoto | 117/108 |
| 4,622,083 | 11/1986 | Shih | 117/108 |
| 4,640,720 | 2/1987 | Foxon | 117/108 |
| 5,403,819 | 4/1995 | Nakamura | 117/108 |

OTHER PUBLICATIONS

Monolithic Integration Of GaAs And $In_{0.2}Ga_{0.8}As$ Lasers By Molecular Beam Epitaxy On GaAs, Berger et al., Appl. Phys. Lett. 58(23), Jun. 10, 1991, pp. 2698–2700.
Pixels Consisting Of Double Vertical–Cavity Detector And Single Vertical–Cavity Laser Sections For 2–D Bidirectional Optical Interconnections, Kosaka et al., Jpn. J. Appl. Phys. vol. 32(1993) pp. 600–603 Part 1. No. 1B, Jan. 1993.

*Primary Examiner*—Robert Kunemund
*Attorney, Agent, or Firm*—Sughrue, Mion, Zinn, Macpeak & Seas

[57] ABSTRACT

A crystal growth method is based on a molecular beam epitaxy method. The crystal growth method includes the steps of opening/closing a shutter member provided between a deposition source and a substrate in an ultra-high vacuum so as to form a region having a predetermined pattern on the substrate and forming a crystal growth layer only in the region having the pattern on the substrate during an epitaxial growth step.

3 Claims, 6 Drawing Sheets

CRYSTAL GROWTH METHOD AND APPARATUS THEREFOR

BACKGROUND OF THE INVENTION

1. Field of the Invention

The present invention relates to a method of selectively forming semiconductor devices such as a semiconductor laser (a laser diode) and a field effect transistor on a substrate, and an apparatus therefor and, more particularly, to integration of these semiconductor devices.

2. Description of the Prior Art

As a conventional method of integrating semiconductor devices having different characteristics on the surface of a substrate, the following techniques of performing crystal growth once, then patterning in the atmosphere, and crystal growth again are known.

One technique of integrating a two-wavelength laser structure is described in Applied Physics Letters, Vol. 58, No. 23, 10 Jun. 1991, pp. 2,698–2,700. According to this technique, a GaAs laser structure having an emission wavelength of 0.85 μm is formed by Molecular Beam Epitaxy (to be referred to as MBE hereinafter), this laser structure is removed by patterning to form stripes at a pitch of 250 μm, and an InGaAs laser structure having an emission wavelength of 1.0 μm is grown again by MBE.

Another technique related to a vertical cavity-type laser is described in Japanese Journal of Applied Physics, Vol. 32 (1993), pp. 600–603. In this technique, one vertical cavity is grown by MBE, and the cavity is removed by patterning to form stripes at a pitch of 125 to 250 μm. Then, a vertical cavity is grown again by MBE to integrate a laser structure of the single cavity and a detector of the double cavity.

In any one of the above two conventional techniques, however, a grown substrate is unloaded into the outer atmosphere after performing crystal growth once in a high vacuum, and patterning is performed on the substrate. Thereafter, crystal growth must be performed on the resultant substrate again in a high vacuum in the growth chamber. These steps complicate the process. In addition, these steps cause degradation in quality of the regrown crystal and formation of a depletion layer at an interface. For this reason, the device characteristics may be inferior to those of a device formed by consistent growth in a vacuum.

SUMMARY OF THE INVENTION

The present invention has been made in consideration of the above situation, and has as its object to provide a crystal growth method by which a shutter means provided between a deposition source and a substrate is opened/closed in an ultra-high vacuum so as to form a region having a predetermined pattern on the substrate, thereby selectively forming a crystal layer in a predetermined region on the substrate only by MBE.

In order to achieve the above object, according to the first aspect of the present invention, there is provided a crystal growth method based on molecular beam epitaxy, comprising the steps of: opening/closing shutter means provided between a deposition source and a substrate in an ultra-high vacuum so as to form a region having a predetermined pattern on the substrate; and forming a crystal growth layer only in the region having the pattern on substrate during an epitaxial growth step.

According to the second aspect of the present invention, there is provided a crystal growth method further comprising the step of rotating the substrate in synchronism with an opening/closing operation portion of the shutter means.

In the crystal growth method described in the first or second aspect, As is supplied to a gap between the shutter means and the substrate during closing the shutter means, or a temperature of the substrate is decreased to about 450° C. during closing the shutter means.

According to the third aspect of the present invention, there is provided a crystal growth apparatus for performing molecular beam epitaxy, comprising a shutter mechanism which is provided between a deposition source and a substrate, has an opening with a predetermined pattern, and can be opened/closed in an ultra-high vacuum.

According to the fourth aspect of the present invention, there is provided a crystal growth apparatus further comprising means capable of rotating the shutter mechanism described in the third aspect in synchronism with the substrate.

According to the present invention, a shutter plate is positioned between the deposition source and the substrate, is freely opened/closed or moved in an ultra-high vacuum, and has an opening having a predetermined pattern. By using this shutter plate, selective crystal growth based on MBE can be performed. Therefore, an optical device such as a laser diode and an electronic device can be integrated on the substrate. According to the method of the present invention, since patterning in the atmosphere and regrowth are not required, the number of steps can be decreased. In addition, crystal growth with high quality can be obtained to improve the device characteristics.

The above and many other advantages, features and additional objects of the present invention will become manifest to those versed in the art upon making reference to the following detailed description and accompanying drawings in which preferred structural embodiments incorporating the principles of the present invention are shown by way of illustrative example.

DETAILED DESCRIPTION OF PREFERRED EMBODIMENTS

The present invention will be described below with reference to preferred embodiments shown in the accompanying drawings.

Figure 1:
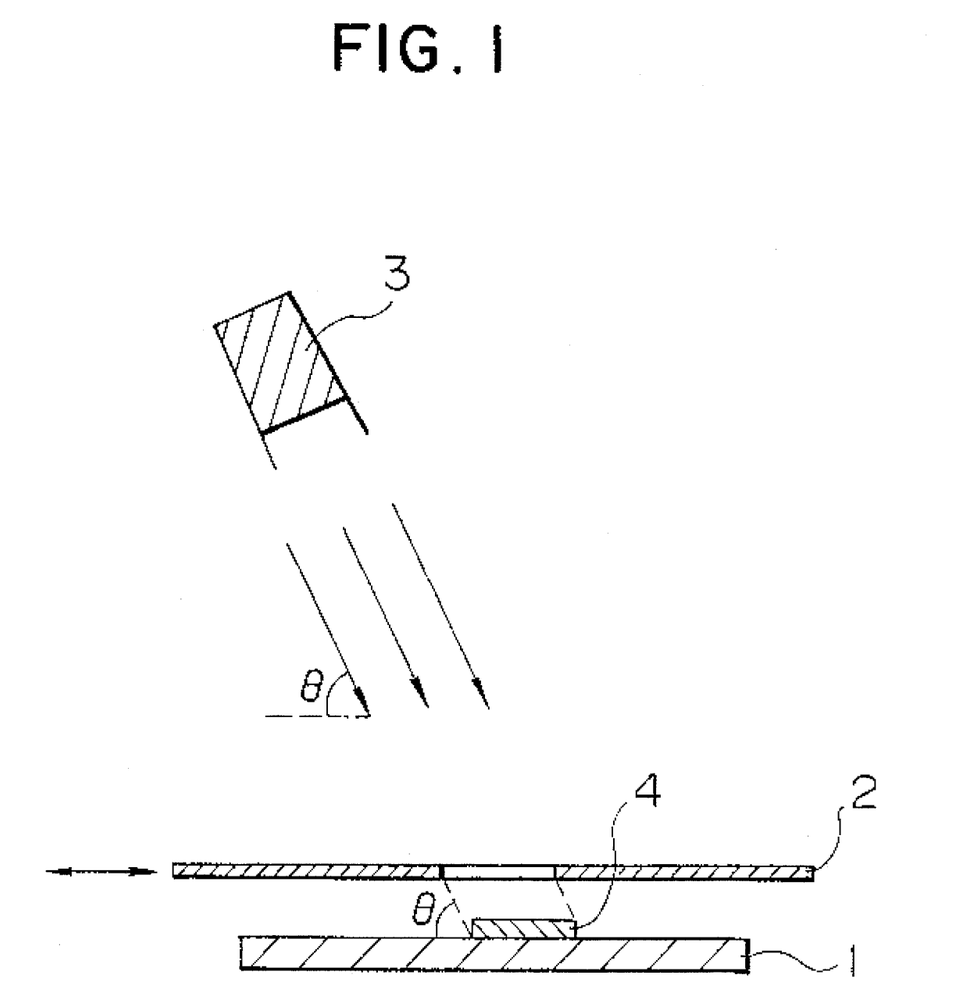
FIG. 1 is a view for explaining the principle of a selective crystal growth method using a shutter plate on the basis of MBE.

As shown in FIG. 1, a shutter plate 2 having a predetermined opening is provided immediately above a substrate 1 in an apparatus for executing MBE. Crystal growth is performed in this state. Since the crystal growth is performed in an ultra-high vacuum, a beam of a vapor 3 moves straight and reaches the substrate 1. The vapor 3 is selectively deposited to grow a layer only in a region which is not covered with the shutter plate. If this shutter plate having the opening is opened/closed or moved by a drive unit in an ultra-high vacuum, patterning can be performed in an arbitrary crystal growth region on the surface of the crystal growth substrate by a consistent vacuum process in a crystal growth chamber. If the shutter portion is rotated together with the substrate, uniformity of the thickness of a grown layer on the surface of the substrate can be obtained.

Figure 2A:
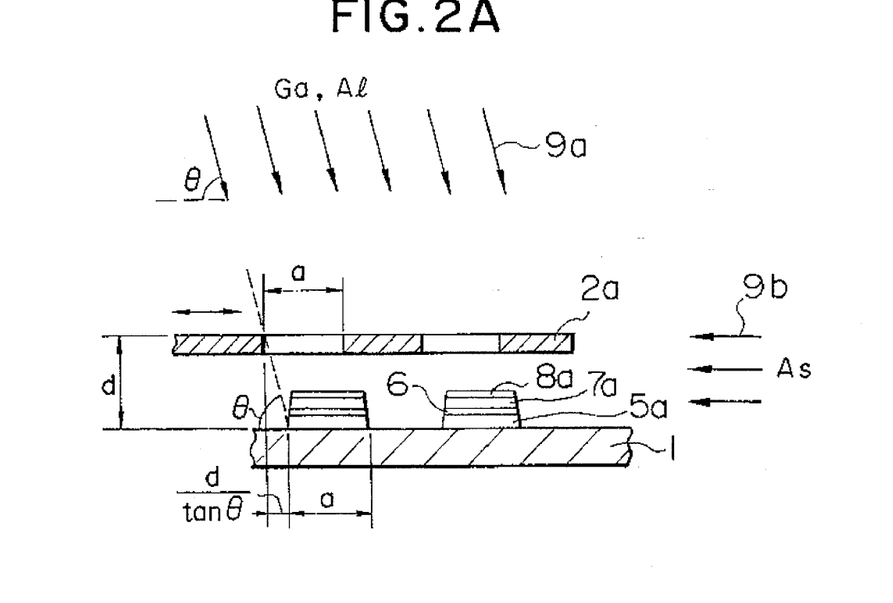
FIGS. 2A to 2C are sectional views showing a process chart according to the first embodiment of the present invention.
Figure 2B:
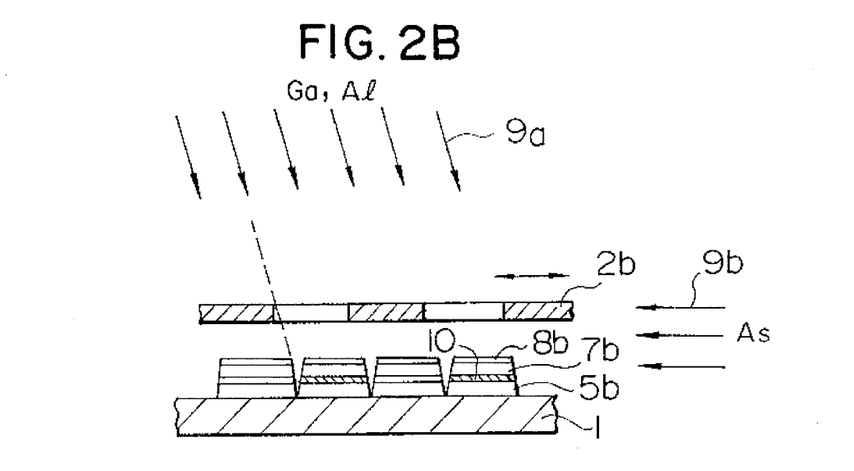
Figure 2C:
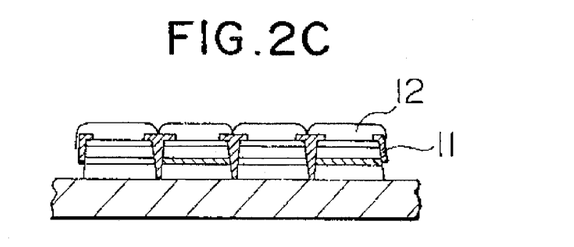

First Embodiment:

FIGS. 2A to 2C are views of steps of integrating lasers having two wavelengths for explaining the first embodiment of the present invention. A 100- μm thick tantalum shutter plate 2a is set immediately above an n-type GaAs substrate 1 by a distance of 200 μm, and has striped openings which are aligned at a pitch of 500 μm and each of which has a width of 250 μm. First of all, this shutter plate 2a is closed (FIG. 2A). In this state, a lower n-type $Al_{0.5}Ga_{0.5}As$ cladding layer (thickness: 1.5 μm) 5a, a GaAs single quantum well layer (thickness: 10 μm ) 6, an upper p-type $Al_{0.5}Ga_{0.5}As$ cladding layer (thickness: 1.5 μm) 7a, and a p-type GaAs contact layer (thickness: 0.2 μm) 8a are sequehtially grown.

At this time, each growth region is determined by the incident direction of a deposition beam 9a, and a positional relationship between the shutter plate 2a and the substrate 1, as shown in FIG. 2A. Assume that the substrate temperature is set at a normal growth temperature of 600° C. In this case, if an As beam is not incident on each region which is shaded by the shutter plate, As is discharged from the surface of the substrate. In order to suppress this discharge of As, an As beam 9b is incident from the horizontal direction with respect to the substrate, and As is supplied from a gap between the shutter and the substrate. The shutter plate 2a is then opened, while another shutter plate 2b is closed (FIG. 2B). This shutter plate 2b has striped openings similar to the above shutter plate 2a. The shutter plate 2b has the following positional relationship with the shutter plate 2a. When the shutters are closed, the openings of the shutter plate 2b are shifted from those of the shutter plate 2a by 250 μm in a direction perpendicular to a direction along which the stripes extend. When the shutter plate 2b is closed to perform crystal growth, the region wherein the deposition beam 9a is shielded by the shutter plate 2a is subjected to crystal growth at this time. In a state of closing the shutter plate 2b, a lower n-type $Al_{0.5}Ga_{0.5}As$ cladding layer (thickness: 1.5 μm) 5b, an $In_{0.2}Ga_{0.8}As$ single quantum well layer (thickness: 10 μm) 10, an upper p-type $Al_{0.5}Ga_{0.5}As$ cladding layer (thickness: 1.5 μm) 7b, and a p-type GaAs contact layer (thickness: 0.2 μm) 8b are sequentially grown. With this operation, a structure wherein lasers of GaAs active layers each for a wavelength of 0.85 μm and lasers of $In_{0.2}Ga_{0.8}As$ active layers each for a wavelength of 1.0 μm are integrated at a pitch of 250 μm can be formed. As shown in FIG. 2C, an $SiO_2$ film 11 is selectively formed, and electrodes 12 are formed on the resultant structure upon crystal growth.

According to this method, the crystal growth including a patterning process is performed in a series of steps in an ultra-high vacuum. Therefore, this method desirably has a smaller number of steps than that of a method wherein a substrate is unloaded into the outer atmosphere once and processed, and then regrowth is performed on the resultant structure. Also, this method has no degradation in crystallinity caused by regrowth.

This embodiment employs the opening/closing shutter mechanism. A shutter mechanism which is moved in the horizontal direction with respect to a substrate may be used. That is, after the shutter plate 2a is closed, and the lasers of the GaAs active layers are grown, the shutter plate 2a is parallelly moved by 250 μm in a direction perpendicular to the direction along which the stripes extend, and then the lasers of the $In_{0.2}Ga_{0.8}As$ active layers are grown.

In the process of manufacturing the above-described integrated structure, although all the crystal growth layers are selectively grown, only the active layers may be selectively grown. That is, in a state of opening the shutter plate, a lower cladding layer 5 is grown entirely on the substrate. After closing the shutter plate 2a, GaAs active layers 6 are grown. Then, after the shutter plate 2a is opened, and the shutter plate 2b is closed, $In_{0.2}Ga_{0.8}As$ active layers 10 are grown. Finally, after opening the shutter plate 2b, an upper cladding layer 7 and a contact layer 8 are grown entirely on the substrate. With this operation, the same structure as that described above can be obtained.

As a method of suppressing the discharge of As caused when the shutter plate is closed, a method of decreasing the temperature of the substrate to about 450° C. after closing the shutter plate to prevent As from being discharged, and a method of depositing As on the surface of the shutter plate at the substrate side to set an As atmosphere around the surface of the substrate using this deposited As even when the shutter is closed are considered in addition to the above method.

Figure 3:
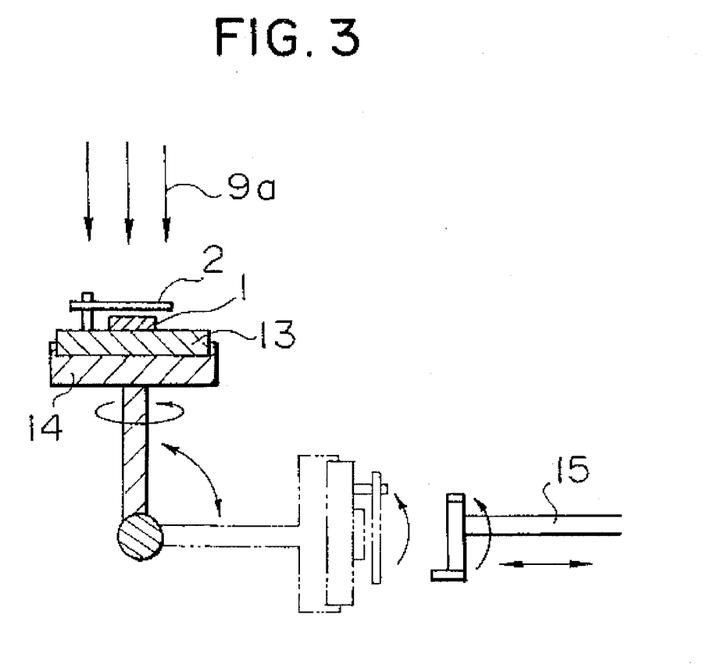
FIG. 3 is a schematic sectional view showing an arrangement when a substrate is rotated in synchronism with a shutter plate.

Generally, in order to uniform the thickness of the crystal growth layer in growth based on MBE, the substrate is rotated during growth. In the selective growth of the present invention, in order to obtain the uniformity in thickness of the growth layer on the surface of the substrate, the substrate is rotated in synchronism with the shutter portion to perform growth. This method can be easily executed by integrally mounting the shutter portion on a substrate rotating mechanism. FIG. 3 shows an arrangement of this shutter portion. As shown in FIG. 3, the shutter plate 2 is integrally mounted on a substrate holder 13. When the shutter is moved above the substrate to change the growth region, growth is stopped temporarily, a manipulator 14 on which the substrate holder 13 is mounted is inclined, and then the shutter plate 2 is rotated by a predetermined angle or horizontally moved by a predetermined distance by another manipulator 15. These steps are performed in an ultra-high vacuum.

Figure 4:
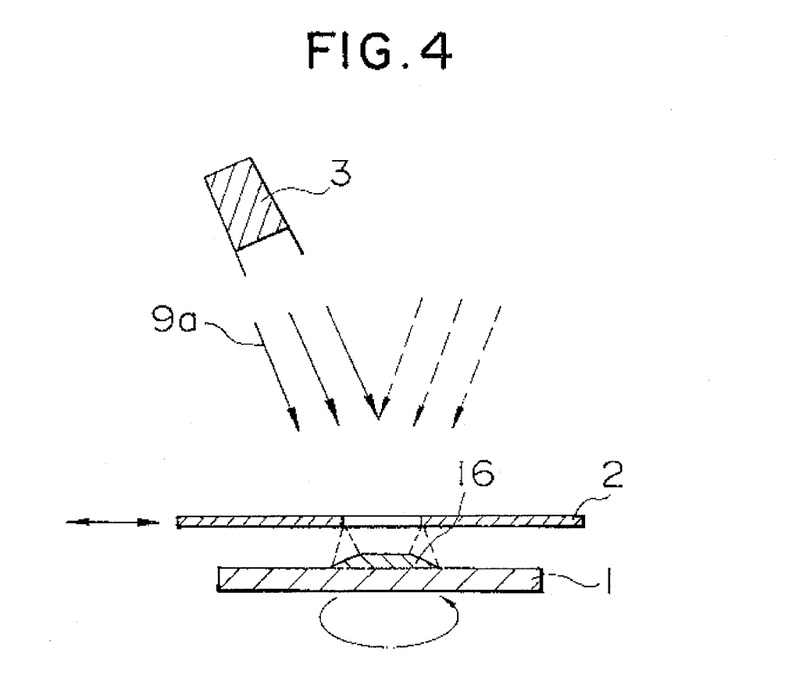
FIG. 4 is a view for explaining the principle of the selective crystal growth method on the basis of MBE when the substrate is rotated in synchronism with the shutter plate.

In an apparatus which does not have an inclining mechanism of the manipulator 14 such as a modification shown in FIG. 3, since the shutter plate 2 is operated from an upper portion from which a deposition beam is supplied, supply of the deposition beam must be temporarily stopped during operation of the shutter plate 2. If the manipulator 14 for setting the holder 13 has an opening/closing introduction mechanism of the shutter plate 2, the introduction mechanism does not shield the deposition beam 9a. Therefore, the shutter plate 2 can be moved instantaneously, and the selective growth can be realized without interrupting growth. When growth is performed during rotating the substrate, the incident direction of the deposition beam is changed with this rotation. For this reason, with the change in incident direction of the beam, a selective growth region 16 is set as shown in FIG. 4 in a positional relationship between a deposition source 3, the shutter plate 2, and the substrate 1.

Second Embodiment:

FIGS. 5A to 5D are sectional views of steps of integrating a single vertical cavity-type laser and a double vertical cavity-type detector for explaining the second embodiment of the present invention. A 100- μm thick tantalum shutter plate 2 is set immediately above an n-type GaAs substrate 1 by a distance of 200 μm, and has striped openings which are aligned at a pitch of 500 μm and each of which has a width of 250 μm. First of all, this shutter plate 2 is opened, and a reflecting multilayered film 17 consisting of 7.5 pairs of n-type Ga. As layers (thickness: 69.5 μnm) and n-type AlAs layers (thickness: 82.9 μnm) is grown by MBE (see FIG. 5A).

Figure 5A:
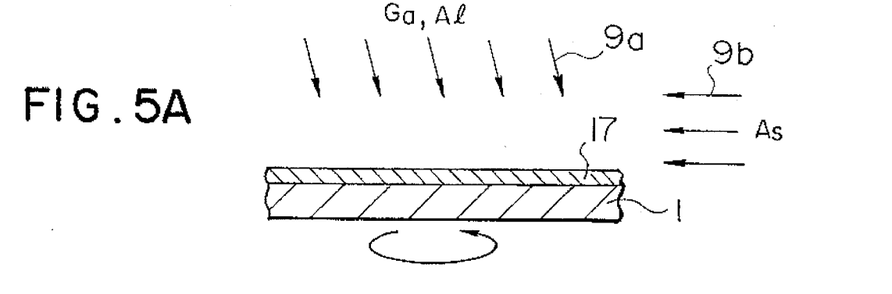
FIGS. 5A to 5D are sectional views showing a process chart according to the second embodiment of the present invention.
Figure 5B:
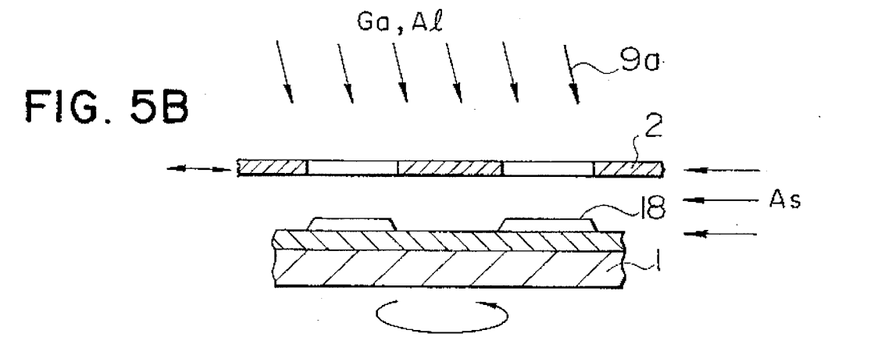

Thereafter, the growth is temporarily stopped, the shutter plate 2 is closed, and GaAs 18 having a film thickness of 278.1 μnm equivalent to a wavelength λ of 980 μnm is grown only in regions of the striped pattern of the openings on the substrate (see FIG. 5B). At this time, the substrate 1 is rotated in synchronism with the shutter plate 2 during growth. An As beam 9b is incident from the horizontal direction with respect to the substrate so as to illuminate the substrate even when the shutter is closed. As is supplied from a gap between the shutter plate 2 and the substrate 1.

Figure 5C:
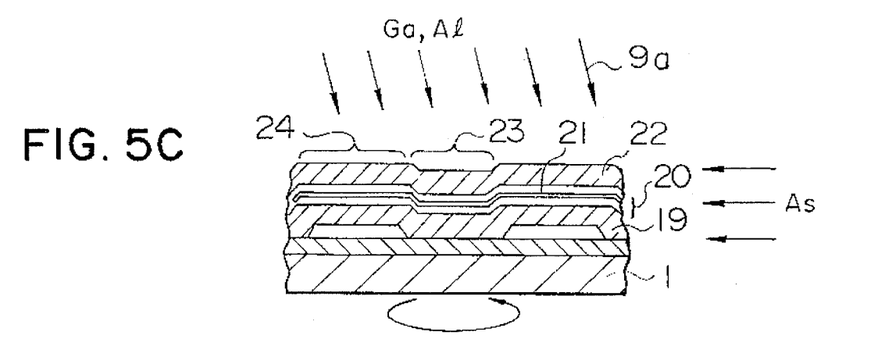

As shown in FIG. 5C, the shutter plate 2 is opened again. Then, an n-type reflecting multilayered film 19 consisting of 15.5 pairs of layers, an $Al_{0.3}Ga_{0.7}As$ layer 20 with a λ thickness (294.1 μnm) including an $In_{0.18}Ga_{0.82}As$ active layer (thickness: 10 μnm) 21, and a p-type reflecting multilayered film 22 consisting of 14.5 pairs of layers are sequentially grown entirely on the substrate. With this operation, a structure wherein a single vertical cavity-type layer 23 and a double vertical cavity-type detector 24 are integrated is formed on the substrate 1. The double cavity is suitable for a detector because it has a wider wavelength band than that of the single cavity.

Figure 5D:
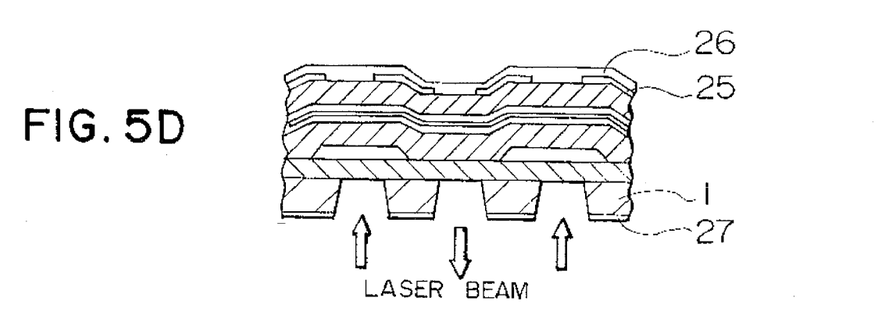

As shown in FIG. 5D, upon crystal growth, an $SiO_2$ film 25, and electrodes 26 and 27 are formed. In this embodiment, the crystal growth including a patterning process is performed in a series of steps in an ultra-high vacuum. Therefore, this method desirably has a smaller number of steps than that of a method wherein a substrate is unloaded into the outer atmosphere once and processed, and then regrowth is performed on the resultant structure. Also, this method has no degradation in crystallinity caused by regrowth. When the selective growth is to be performed, the thickness of the growth layer can be controlled on the order of subnanometers using the MBE growth. By rotating the substrate, the surface of the substrate is highly uniformed.

Figure 6:
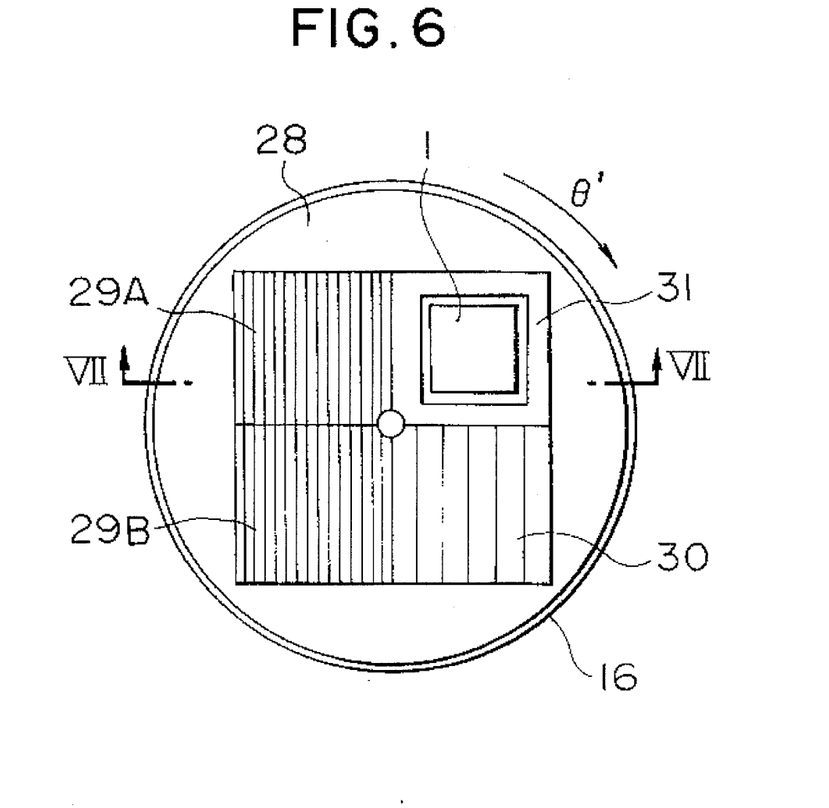
FIG. 6 is a schematic plan view showing a shutter plate used in the third embodiment of the present invention.
Figure 7:
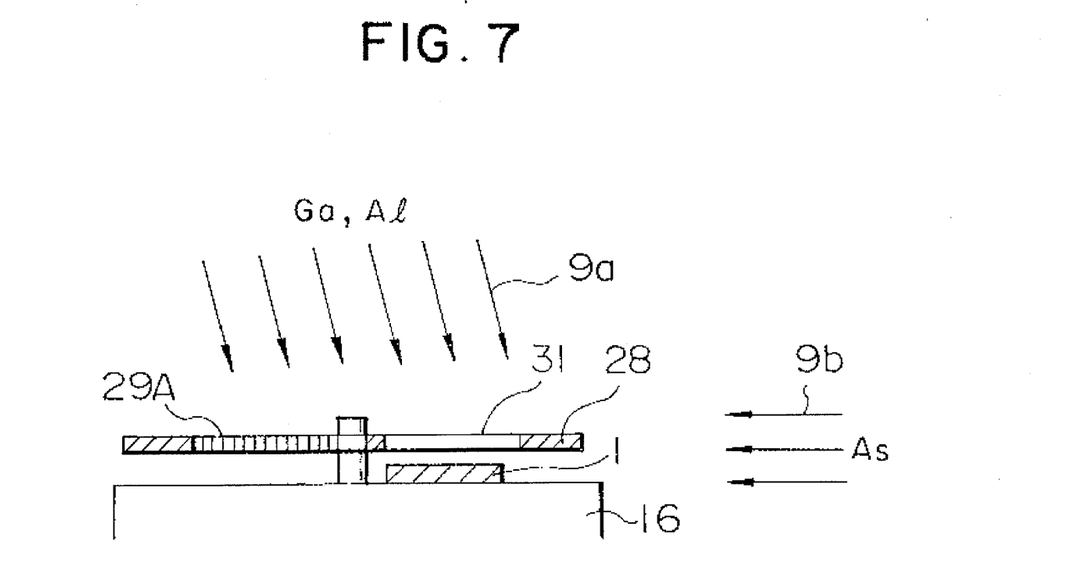
FIG. 7 is a schematic sectional view taken along a line VII—VII in FIG. 6 which shows an arrangement of an apparatus for practicing the third embodiment of the present invention.
Figure 8A:
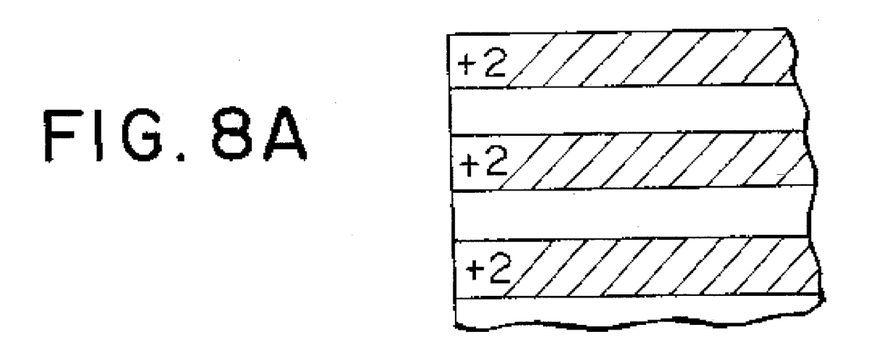
FIGS. 8A to 8C are views showing part of the upper surface of a substrate for explaining steps according to the third embodiment of the present invention.
Figure 8B:
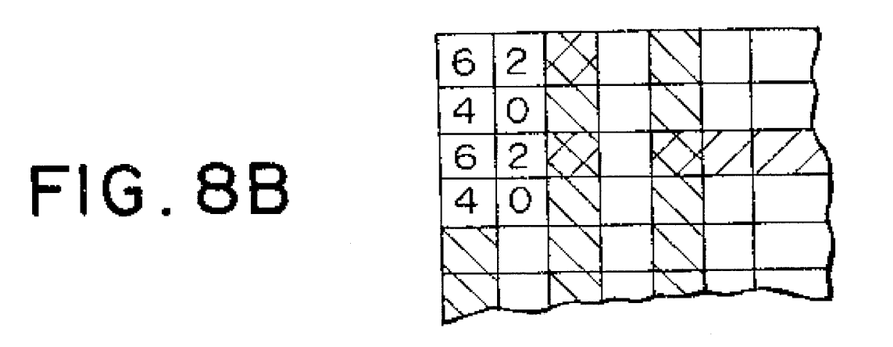
Figure 8C:
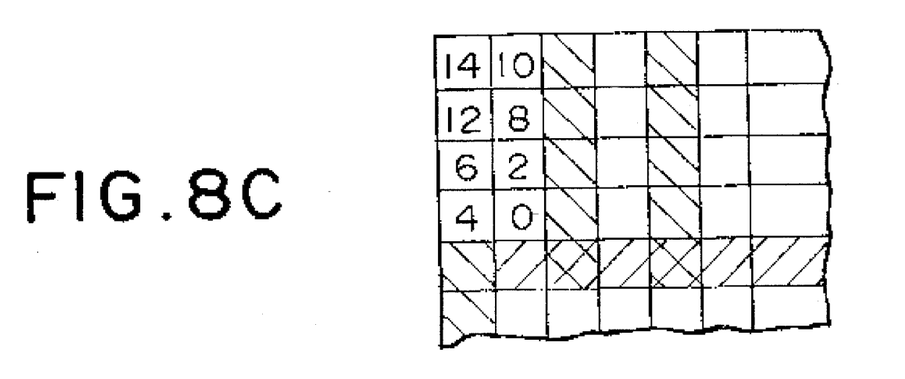

Third Embodiment:

FIGS. 8A to 8C are views of steps of integrating vertical cavity-type lasers having eight wavelengths for explaining the third embodiment of the present invention. As shown in FIG. 6, a 100- μm thick shutter plate 28 has regions 29A, 29B, and 30, and an opening 31 having each side of 2 cm around the rotation center of the shutter. In each of the regions 29A and 29B, striped openings each having a width of 250 μm are aligned at a pitch of 500 μm, and in the region 30, striped openings each having a width of 500 μm are aligned at a pitch of 1,000 μm. As shown in FIG. 7, the shutter plate 28 is positioned to be vertically spaced apart from a substrate 1 by 200 μm. First of all, the shutter plate 28 is positioned-to set the opening 31 having each side of 2 cm above the GaAs substrate 1. A reflecting multilayered film consisting of 15 pairs of n-type GaAs layers (thickness: 71.2 μm) and n-type AlAs layers (thickness: 84.7 μnm), and an $Al_{0.25}Ga_{0.75}As$ interlayer including an 10- μm thick $In_{0.18}Ga_{0.75}As$ active layer are grown to have a thickness of 291.4 μnm by MBE. The reflecting multilayered film has a high reflectance of 99.9% or more, and its reflection band has a wavelength of 950 μnm to 1,050 μnm. The thickness of the interlayer is equivalent to a wavelength λ of 980 μnm.

The shutter plate 28 is rotated through 90° to set the region 29A with the 250- μm wide striped openings above the substrate 1. As shown in FIG. 8A, $Al_{0.25}Ga_{0.75}As$ is grown to have a thickness of 2 μm. The shutter plate 28 is further rotated through 90° to set the region 29B with the 250- μm wide striped openings above the substrate 1. As shown in FIG. 8B, $Al_{0.25}Ga_{0.75}As$ is grown to have a thickness of 4 μnm. The shutter plate 28 is still further rotated through 90° to set the region 30 with the 500- μm wide striped openings above the substrate 1. As shown in FIG. 8C, $Al_{0.25}Ga_{0.75}As$ is grown to have a thickness of 8 μnm. Reference numerals in FIGS. 8A to 8C denote thicknesses by which the interlayer is increased from the initial thickness of 291.4 μnm. With this operation, the interlayers finally have eight thicknesses from 291.4 μnm to 305.4 μnm for every step of 2 μnm in a region having a size of 500 μm×1,000 μm. These thicknesses are converted into eight wavelengths λ from 980 μnm to 1,020 μnm. The shutter plate 28 is still further rotated through 90° to set the opening 31 having each side of 2 cm above the substrate 1. A p-type reflecting multilayered film consisting of 20 pairs of layers is grown. After the MBE growth, electrodes are formed (not shown). With this operation, the vertical cavity-type lasers having eight wavelengths from 980 μnm to 1,020 μnm for every step of about 5 μnm can be integrated.

What we claimed is:

1. A crystal growth method based on a molecular beam epitaxy method, comprising the steps of:

opening/closing shutter means provided between a deposition source and a substrate in an ultra-high vacuum so as to form a region having a pattern on said substrate;

forming a crystal growth layer only in the region having said pattern on said substrate during an epitaxial growth step; and rotating said substrate in synchronism with an opening/closing operation of said shutter means.

2. A crystal growth method based on a molecular beam epitaxy method, comprising the steps of:

opening/closing shutter means provided between a deposition source and a substrate in an ultra-high vacuum so as to form a region having a pattern on said substrate;

forming a crystal growth layer only in the region having said pattern on said substrate during an epitaxial growth step; and wherein As is supplied to a gap between said shutter means and said substrate during closing of said shutter means.

3. A crystal growth method based on a molecular beam epitaxy method, comprising the steps of:

opening/closing shutter means provided between a deposition source and a substrate in an ultra-high vacuum so as to form a region having a pattern on said substrate;

forming a crystal growth layer only in the region having said pattern on said substrate during an epitaxial growth step; and wherein a temperature of said substrate is decreased during closing of said shutter means.

* * * * *

UNITED STATES PATENT AND TRADEMARK OFFICE
CERTIFICATE OF CORRECTION

PATENT NO.     :  5,537,951
DATED          :  July 23, 1996
INVENTOR(S)    :  Hideaki SAITO It is certified that error(s) appears in the above-identified patent and that said Letters Patent is hereby corrected as shown below:

Column 5,   line 15, delete "69.5 µnm" and insert --69.5 nm--;
            line 16, delete "82.9 µnm" and insert --82.9 nm--;
            line 20, delete "278.1 µnm" and insert --278.1 nm--;
            line 20, delete "980 µnm" and insert --980 nm--;
            line 31, delete "294.1 µnm" and insert --294.1 nm--;
            line 32, delete "10 µnm" and insert --10 nm--.

Column 6,   line 2, delete "84.7 µnm" and insert --84.7 nm--;
            line 3, delete "10 µnm" and insert --10 nm--;
            line 5, delete "294.1 µnm" and insert --294.1 nm--;
            line 7, delete "950 µnm to 1,050 µnm" and
insert --950 nm to 1,050 nm--;
            line 8, delete "980 µnm" and insert --980 nm--;
            line 15, delete "4 µnm" and insert --4 nm--;
            lines 18 and 19, delete "8 µmn" and insert --8 nm--;
            line 21, delete "291.4 µnm" and insert --291.4 nm--.

UNITED STATES PATENT AND TRADEMARK OFFICE
CERTIFICATE OF CORRECTION

PATENT NO. : 5,537,951
DATED : July 23, 1996
INVENTOR(S) : Hideaki Saito

PAGE 2 OF 2

It is certified that error appears in the above-indentified patent and that said Letters Patent is hereby corrected as shown below:

Column 6, line 22, delete "291.4 µnm to 305.4 µnm" and insert --291.4 nm to 305.4 nm--;
line 23, delete "2 µnm" and insert -- 2 nm--;
line 25, delete "980 µnm to 1,020 µnm" and insert --980 nm to 1,020 nm--;
line 30, delete "980 µnm to 1,020 µnm" and insert --980 nm to 1,020 nm--;
line 31, delete "5 µnm" and insert --5 nm--.

Signed and Sealed this

Nineteenth Day of November, 1996

BRUCE LEHMAN

Attest:

Attesting Officer

Commissioner of Patents and Trademarks